United States Patent [19]

Watanabe et al.

[11] 4,429,326
[45] Jan. 31, 1984

[54] I²L MEMORY WITH NONVOLATILE STORAGE

[75] Inventors: Tomoyuki Watanabe, Kodaira; Kenji Kaneko, Hachioji; Tohru Nakamura, Houya; Yutaka Okada, Kokubunji; Takahiro Okabe, Hinodemachi; Minoru Nagata, Kodaira; Yokichi Itoh, Hachioji; Toru Toyabe, Kokubunji, all of Japan

[73] Assignee: Hitachi, Ltd., Tokyo, Japan

[21] Appl. No.: 96,388

[22] Filed: Nov. 21, 1979

[30] Foreign Application Priority Data

Nov. 29, 1978 [JP] Japan ............................... 53-146486
Nov. 29, 1978 [JP] Japan ............................... 53-146487
Feb. 19, 1979 [JP] Japan ............................... 54-19086[U]

[51] Int. Cl.³ .................. G11C 11/40; H03K 19/091; H01L 27/04; H01L 29/78
[52] U.S. Cl. ............................... 357/43; 357/23; 357/92; 365/95; 365/184
[58] Field of Search .............. 357/92, 23 VT, 43, 46, 357/54; 365/95, 184, 185, 155

[56] References Cited

U.S. PATENT DOCUMENTS

| | | | |
|---|---|---|---|
| 3,643,235 | 2/1972 | Berger et al. | 357/92 |
| 3,662,351 | 5/1972 | Ho et al. | 357/23 VT |
| 3,755,721 | 8/1973 | Frohman-Bentchkowsky | 357/23 VT |
| 3,801,967 | 4/1974 | Berger et al. | 357/92 |
| 3,868,187 | 2/1975 | Masuoka | 357/23 VT |
| 3,893,085 | 7/1975 | Hansen | 357/23 VT |
| 3,893,151 | 7/1975 | Bosselaar et al. | 357/23 VT |
| 4,019,198 | 4/1977 | Endo et al. | 357/23 VT |
| 4,217,688 | 8/1980 | Ipri | 357/46 |
| 4,237,472 | 12/1980 | Hollingsworth | 357/46 |
| 4,244,001 | 1/1981 | Ipri | 357/92 |
| 4,247,861 | 1/1981 | Hsu | 357/46 |

FOREIGN PATENT DOCUMENTS

| | | | |
|---|---|---|---|
| 52-10087 | 1/1977 | Japan | 357/92 |
| 52-10088 | 1/1977 | Japan | 357/92 |
| 52-45885 | 4/1977 | Japan | 357/92 |
| 680051 | 8/1979 | U.S.S.R. | 357/23 VT |

Primary Examiner—William D. Larkins
Attorney, Agent, or Firm—Antonelli, Terry & Wands

[57] ABSTRACT

An I²L type nonvolatile memory of this invention has a structure wherein a floating gate is disposed through an insulating film on the surface of a semiconductor layer in the vicinity of a base region of an NPN transistor in an I²L. The I²L type nonvolatile memory of this invention controls current to flow through the base region of the NPN transistor of the I²L, by means of charges to be stored in the floating gate. That is, the collector output current of the NPN transistor of the I²L is modulated in dependence on the presence or absence of a channel underneath the floating gate as is generated depending on the presence or absence of charges within the floating gate and the polarity of the charges. As a result, the variation of the base current appears as an output signal at a collector terminal of the NPN transistor of the I²L, and data stored in the floating gate can be read out.

17 Claims, 44 Drawing Figures

I²L MEMORY WITH NONVOLATILE STORAGE

BACKGROUND OF THE INVENTION (1) Field of the Invention

This invention relates to a nonvolatile semiconductor memory. More particularly, the invention relates to an integrated injection logic device (hereafter referred to as I²L) having a nonvolatile memory function.

(2) Description of the Prior Art

The I²L is a new logic device which was published in H. H. Benger and S. K. Wiedman: Merged-Transistor Logic (MTL)-A Low-Cost Bipolar Logic Concept; IEEE J. of SSC, sc-7, 5, p. 340–346 (1972, October), K. Hart and A. Slob: Integrated Injection Logic: A New Approach to LSI; IEEE J. of SSC, sc-7, 5, p. 346–351 (1972, October), etc. The I²L is noted in points of permitting a high packing density, having a wide range of application, being compatible with conventional bipolar transistors, etc.

FIG. 1A shows an equivalent circuit of the I²L, and FIG. 1B a sectional structure of the device. As shown in FIG. 1A, the I²L is expressed as the combination of a common base type PNP transistor 11 and a common emitter type NPN transistor 12. The emitter I of the transistor 11 is usually called the "injector," and a power supply is connected to this terminal. The base B of the transistor 12 is made an input terminal, and the collectors $C_1$ to $C_3$ are made output terminals, thereby to derive outputs in the multi-collector system. As the transistor 12 an ordinary planar type transistor is used by inverting its emitter and collector, and the emitter E is grounded in common for the whole device. This situation is apparent from the sectional view of FIG. 1B, and a lateral transistor is employed as the PNP transistor 11, in which a P-type region (having, for example, an impurity concentration on the order of $10^{18}$ cm$^{-3}$) 13 is the emitter, an N-type epitaxial-grown semiconductor layer (having, for example, an impurity concentration on the order of $10^{16}$ cm$^{-3}$) 14 is the base and a P-type region (having, for example, an impurity concentration on the order of $10^{18}$ cm$^{-3}$) 15 is the collector. On the other hand, the NPN transistor 12 is constructed in such a manner that each N-type region (having, for example, an impurity concentration on the order of $10^{20}$ cm$^{-3}$) 16 is the collector, that the P-type region 15 is the base and that the N-type epitaxial-grown semiconductor layer (for example, N-type Si epitaxial layer) 14 is the emitter. An N$^+$-type buried layer 191 and an N$^+$-type region 192 (having, for example, an impurity concentration on the order of $10^\circ$cm$^{-3}$) serve to lead out the common ground terminal. The region 192 serves to prevent the crosstalk between adjacent gates. It is called the "N$^+$-type collar," and it sometimes has a shallow region part besides a part contacting with the region 191 and surrounds the I²L. Shown at 17 is an insulating film (of SiO$_2$ or the like). Numeral 181 designates an injector electrode, numeral 182 a base electrode, numerals 183, 183' and 183" collector electrodes and numeral 184 a ground electrode, and they are made of Al or the like. Numeral 10 indicates a semiconductor substrate of the P-type conductivity, which is made of P-type Si or the like.

As apparent from the figure, the collector of the PNP transistor 11 and the base of the NPN transistor 12 are the identical P-type semiconductor region 15. The base of the PNP transistor 11 and the emitter of the NPN transistor 12 are the N-type epitaxial layer 14, which is common for the whole device.

The I²L above stated is small in the device area which it occupies and low in its power dissipation. In addition, it is readily integrated on a monolithic semiconductor IC chip together with an analog circuit employing bipolar transistors. Therefore, it is being extensively employed.

SUMMARY OF THE INVENTION

This invention has for its object to improve upon the prior-art I²L and to provide an I²L having a new function.

That is, this invention has for its object to add a memory function, especially nonvolatile memory function to the prior-art I²L.

Accordingly, this invention provides an I²L type nonvolatile memory.

In order to accomplish the object, the I²L type nonvolatile memory of this invention is constructed of an I²L comprising:
at least one of;
(1) a floating gate which is disposed on a base region of (i) a lateral PNP transistor and/or (ii) an inverse NPN transistor through an insulating film, and
(2) a floating gate which is disposed through an insulating film on a surface region of a semiconductor substrate lying between a control region formed in opposition to a base region of an inverse NPN transistor and the base region, and
means for injecting carriers into the floating gate or gates.

More specifically, the first form of the I²L type nonvolatile memory of this invention has a structure wherein a P-type control region is disposed in the vicinity of a base region of an NPN transistor of an I²L, and a floating gate is disposed through an insulating film on the surface of a semiconductor layer lying between the base region and the P-type control region. The I²L type nonvolatile memory of this invention controls current flowing through the base region of the NPN transistor of the I²L, by means of charges to be stored in the floating gate. That is, the base current of the I²L gate is caused to flow into the P-type control region through a channel under the floating gate which develops depending upon the existence or nonexistence and the polarity of the charges within the floating gate, whereby the collector output current of the NPN transistor of the I²L is controlled. As a result, a variation in the base current appears as an output signal at the collector terminal of the NPN transistor of the I²L, and data stored in the floating gate can be read out.

The second form of the I²L type nonvolatile memory of this invention has a structure wherein a floating gate is disposed on a base region of a lateral PNP transistor of an I²L through an insulating film. The nonvolatile memory according to this invention controls the carrier concentration of a surface region of an N-type epitaxial-grown semiconductor layer serving as the base region of the PNP transistor of the I²L, by means of charges to be stored in the floating gate.

That is, the base current of the PNP transistor is modulated depending upon the existence or nonexistence, the number and the polarity of the charges within the floating gate, and current to be supplied to an inverse NPN transistor is varied. This variation of the current is amplified by the inverse NPN transistor, and the amplified collector current is detected as an output signal current, whereby the readout of the nonvolatile memory of this invention is performed.

DESCRIPTION OF THE PREFERRED EMBODIMENTS

Hereunder, this invention will be described in detail with reference to embodiments.

Figure 2A:
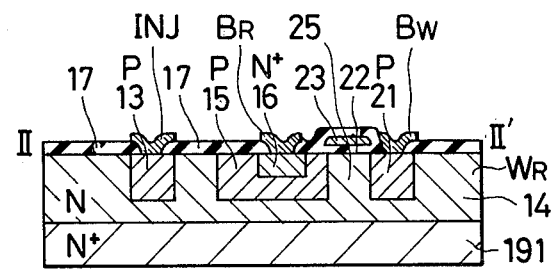
FIG. 2A is a sectional view showing a device structure of a first embodiment of an I²L type nonvolatile memory of this invention.
Figure 2B:
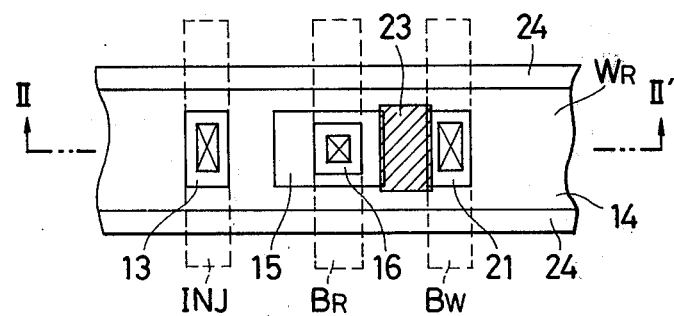
FIG. 2B is a schematic layout pattern of the first embodiment of the I²L type nonvolatile memory of this invention.

Embodiment 1:

FIGS. 2A and 2B are views for explaining a first embodiment of the nonvolatile memory of this invention. FIG. 2A shows a structural sectional view, and FIG. 2B a schematic layout pattern. FIG. 2A is taken along line II—II' in FIG. 2B. In the figures, a region 21 is a P-type region (for example, at an impurity concentration of $10^{17}$–$10^{19}$ cm$^{-3}$). Between a base region (for example, at an impurity concentration of $10^{17}$–$10^{19}$ cm$^{-3}$) 15 of an NPN transistor and the P-type region 21, a floating gate (formed of polycrystalline silicon or the like and having, for example, a film thickness of 0.1–1 μm and a sheet resistance of 20–100 Ω/□) 23 is disposed through an insulating film (SiO$_2$ film or the like) 22.

Current to be injected from an injector (being a P-type region and having an impurity concentration of, for example, $10^{17}-10^{19}$ cm$^{-3}$) 13 into the base region 15 is controlled by charges to be stored in the floating gate 23. A region (N-type Si epitaxial-grown layer or the like having an impurity concentration of, for example, $10^{15}-10^{16}$ cm$^{-3}$) 14 serves as a word line (WR), and it is made common to only I$^2$Ls in a word line direction by isolation regions which are P-type regions (having an impurity concentration of, for example, $10^{20}$ cm$^{-3}$) 24 in FIG. 2B.

In the device according to this embodiment, the memory is constructed owing to operations as stated below.

(1) In case where no electron exists within the floating gate 23, the channel of a MIS (Metal-Insulator-Semiconductor) type field effect transistor (hereinafter, abbreviated to "MISFET") Q$_{21}$ is not formed in an N-type region 25 underneath the gate, and hence, the present device operates as the conventional I$^2$L.

(2) When electrons exist within the floating gate 23, the channel is formed in the N-type region 25 underneath the gate. As a result, holes injected from the injector region 13 pass through the base region 15, flow into the channel region and flow out to the P-type region 21. At this time, therefore, the base current of the NPN transistor becomes smaller and also current flowing through the collector (being an N$^+$-type region and having an impurity concentration of, for example, $10^{19}-10^{21}$ cm$^{-3}$) 16 thereof becomes smaller than in the case of (1).

Since, as stated above, the number of electrons stored in the floating gate 23 can be detected as the variation of the collector current, the memory device operation becomes possible. The writing and reading of this memory are carried out as follows.

Figure 3:
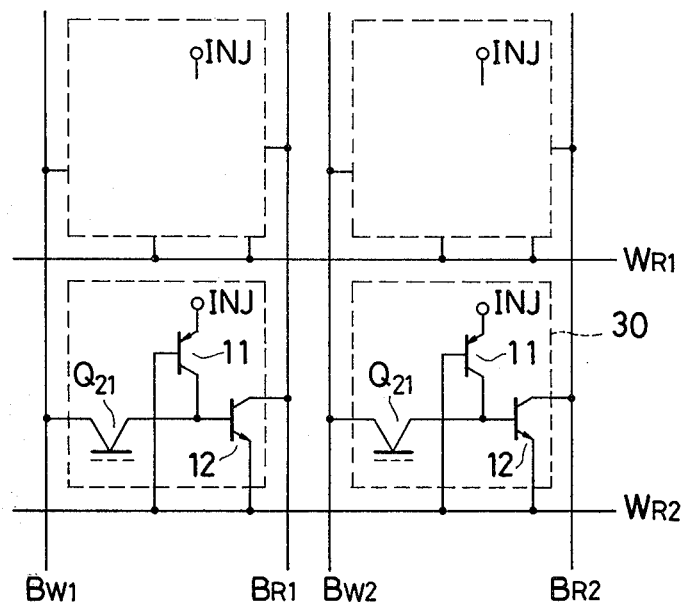
FIG. 3 is a schematic circuit diagram of a memory matrix in which the I²L type nonvolatile memory of the first embodiment is employed for a memory cell.

(1) Writing mode:

FIG. 3 shows a memory matrix which employs this device for a memory cell. In the writing, a word line WR2 and a bit line BW2 are used to select a cell 30 by way of example. The junction between the N-type region 14 (word line WR) and the P-type region 21 (bit line BW) is caused to break down (at a breakdown voltage of, for example, 10–100 V) to inject electrons into the floating gate. It is to be noted that when a part of the junction between the N-type layer 14 and the P-type region 21 is formed with an N$^+$-type region in contact with the P-type region, the breakdown takes place at a lower voltage, so the writing voltage can be lowered.

(2) Reading mode:

When the word line WR2 is made the zero potential (with the injection voltage being about 0.7 V), whether the memory cell 30 is of "1" or "0" can be decided by detecting current which flows through a bit line BR2. Word lines other than the appointed word line need to be maintained at the high level (0.7 V).

The memory content is erased by irradiating the device with ultraviolet rays (for 10–100 minutes or so).

Figure 4A:
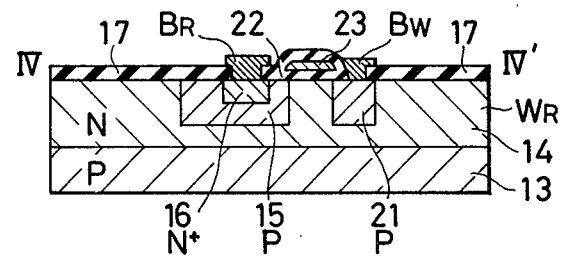
FIG. 4A is a sectional view showing a device structure of a second embodiment of the I²L type nonvolatile memory of this invention.
Figure 4B:
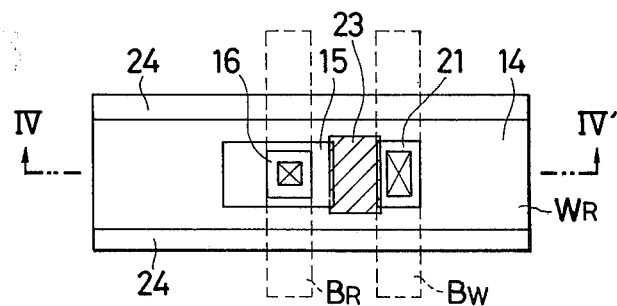
FIG. 4B is a schematic layout pattern of the second embodiment of the I²L type nonvolatile memory of this invention.

Embodiment 2:

The device structure of a memory cell is as shown in FIGS. 4A and 4B, and the substrate is employed as the injector 13. Thus, the area becomes small to permit a high packing density of the LSI. In this case, all the writing, reading and erasure are the same as in the case of Embodiment 1. FIG. 4A is a sectional view taken along line IV–IV′ in FIG. 4B of a schematic layout pattern.

Figure 5A:
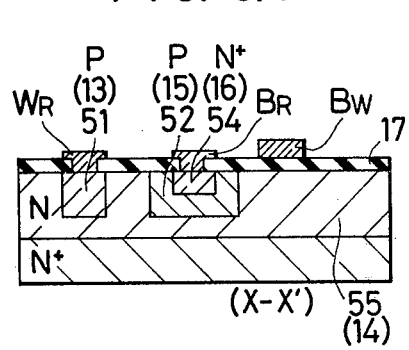
FIG. 5A is a sectional view showing a device structure of a third embodiment of the I²L type nonvolatile memory of this invention.
Figure 5B:
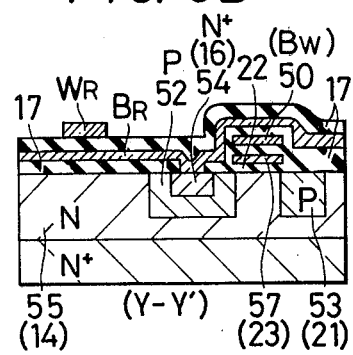
FIG. 5B is a sectional view of a device structure of another part of the third embodiment of the I²L type nonvolatile memory of this invention.
Figure 5C:
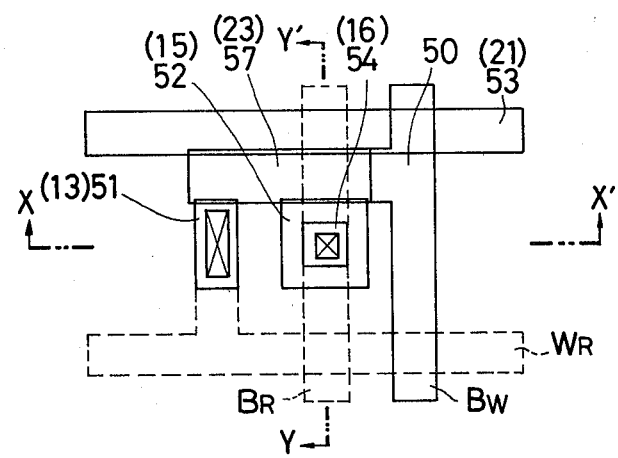
FIG. 5C is a schematic layout pattern of the third embodiment of the I²L type nonvolatile memory of this invention.
Figure 5D:
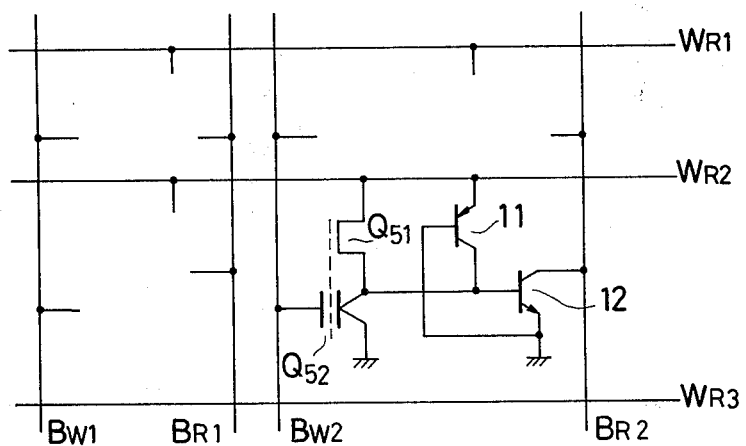
FIG. 5D is a schematic circuit diagram of a memory matrix in which the I²L type nonvolatile memory of the third embodiment of this invention is employed as a memory cell.

Embodiment 3:

FIGS. 5A, 5B, 5C and 5D show an embodiment in the case where, as a writing expedient, a writing gate electrode 50 is disposed on a floating gate 57. FIGS. 5A and 5A are sectional views, FIG. 5C is a schematic layout pattern, and FIG. 5D is a schematic circuit diagram showing a memory matrix which employs the device of this embodiment as a memory cell. FIG. 5A is taken along line X–X′ in FIG. 5C, and FIG. 5B is taken along line Y–Y′ in FIG. 5C. In this case, it is unnecessary to employ an emitter region 55 of the NPN transistor as the word line. Therefore, the isolation regions can be omitted, and the packing density of the LSI can be made high as compared with those of the preceding embodiments. In the writing, a negative bias voltage is applied to a word line WR (P-type region 51), to cause its junction with the N-type region 55 to break down, and a positive voltage is applied to a bit line BW being the control gate, to inject electrons in hot carriers into the floating gate.

In reading out data, when the word line WR is made a high level (about 0.7 V), the data can be decided depending on the magnitude of current flowing through the bit line BR. During the readout, word lines other than the appointed line WR must be held at the zero potential. The structure of this device is characterized in that the injector region 51 is employed as the word line.

As an example of an aspect of performance of this invention, a similar device structure is employed, and instead of the floating gate, the so-called MNOS type memory device which consists of a gate electrode M made of metal or polycrystalline silicon, a silicon nitride film N and a thin silicon oxide film O is formed, charges being stored in the vicinity of the interface between the N and O films, whereby the generation or recombination of a channel in the underlying silicon surface is controlled and the same effect can be realized. It is needless to say that other nonvolatile memory device structures are applicable to the charge storage portion.

The essential points of the foregoing embodiments 1, 2 and 3 are as follows:

(1) A nonvolatile memory device wherein using an I$^2$L circuit, the base current of an NPN transistor can be detected as the collector current by modulating the former in dependence on the number of charges within a floating gate and amplifying the modulated current.

(2) A device structure wherein charges to be injected into a floating gate are generated by causing the break down of the junction between an emitter region of an NPN transistor and a P-type control region formed on the side opposite to an injector region with respect to a base region (first embodiment).

(3) A device structure wherein a substrate is used as an injector region, and the remaining device structure is made the same as in the case (2) (second embodiment).

(4) A device structure wherein an injector line is used as a writing bit line (third embodiment).

(5) A nonvolatile memory device structure wherein using a MOS type nonvolatile memory device in which charges are stored in insulators as in an MNOS type device structure, a channel in the surface of an Si substrate is controlled to modulate the base current of an NPN transistor in an I$^2$L.

Figure 6A:
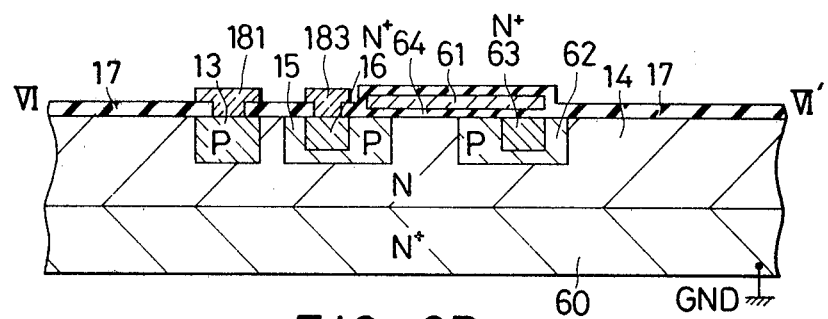
FIG. 6A is a sectional view showing a device structure of a fourth embodiment of the I²L type nonvolatile memory of this invention.
Figure 6B:
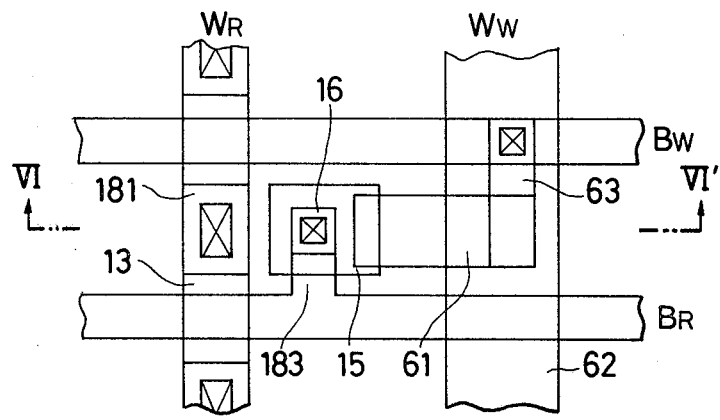
FIG. 6B is a schematic layout pattern of the fourth embodiment of the I²L type nonvolatile memory of this invention.
Figure 6C:
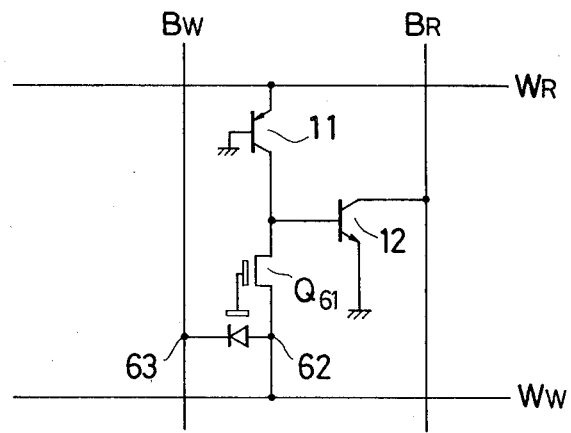
FIG. 6C is an equivalent circuit diagram of the fourth embodiment of the I²L type nonvolatile memory of this invention.

Embodiment 4:

FIGS. 6A, 6B and 6C show a fourth embodiment. FIG. 6A is a sectional view taken along line VI-VI' in a schematic layout pattern of FIG. 6B, and FIG. 6C is an equivalent circuit diagram. Numeral 60 designates an N$^+$-type layer, which may be either an N$^+$-type substrate (such as N$^+$-type Si substrate) or an N$^+$-type buried layer in an LSI as that 191 in FIG. 2A. By way of example, it has an impurity concentration of $10^{18}$–$10^{21}$ cm$^{-3}$.

The memory of this embodiment is such that the existence or nonexistence of the channel of a MIS field effect transistor Q$_{61}$ is caused between P-type regions (at an impurity concentration of, for example, $10^{17}$–$10^{19}$ cm$^{-3}$) 15 and 62 by the existence or nonexistence of charges in a floating gate (made of polycrystalline Si or the like and having a sheet resistance of, for example, 10–100 Ω/□) 61. As a result, the conduction from the base 15 of the I$^2$L to the P-type region 62 ordinarily held at the ground potential is modulated. Therefore, in the injector current to be injected from an injector (being a P-type region and having an impurity concentration of, for example, $10^{17}$–$10^{19}$ cm$^{-3}$) 13 into the base 15, current to ineffectively flow out into the P-type region 62 undergoes a variation, and the absorption current of a collector (being an N$^+$-type region and having an impurity concentration of, for example, $10^{19}$–$10^{21}$ cm$^{-3}$) 16 varies.

At this time, the collector current becomes the multiplication of the base current by a current gain, so that the variation of the collector current is great. By detecting this variation, the readout is executed. In the present embodiment, each cell has an N$^+$-type region (at an impurity concentration of, for example, $10^{19}$–$10^{21}$ cm$^{-3}$) 63 for writing.

The operations of the memory of the present embodiment will be explained below.

(1) Writing mode; A positive potential (about 5–50 V) with respect to the potential of a line WW (P-type region 62) is applied to a line BW (in contact with the N-type region 63), to cause the avalanche breakdown between the regions 62 and 63 and to accumulate electrons into the floating gate 61 on an insulating film (made of SiO$_2$ or the like and having a thickness of, for example, 0.01–0.1 μm) 64.

(2) Erasing mode; Executed with ultraviolet rays.

(3) Reading mode; With the line WW held at the ground potential and with current applied from a line WR (coupled to an injector electrode 181 and having a voltage of about 0.7 V applied thereto), the level of a line BR (coupled to a collector electrode 183) being the collector output of the I$^2$L is decided.

Figure 7A:
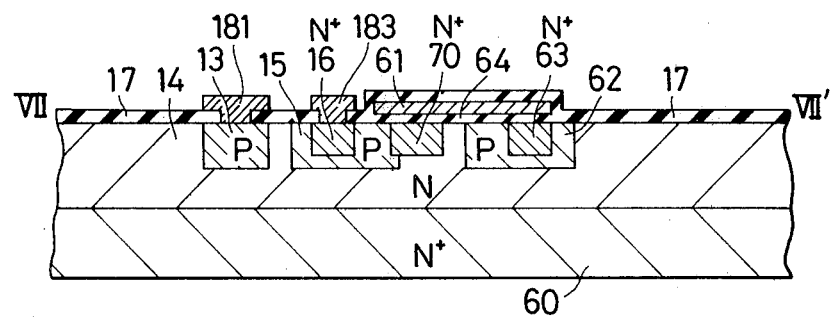
FIG. 7A is a sectional view showing a device structure of a fifth embodiment of the I²L type nonvolatile memory of this invention.
Figure 7B:
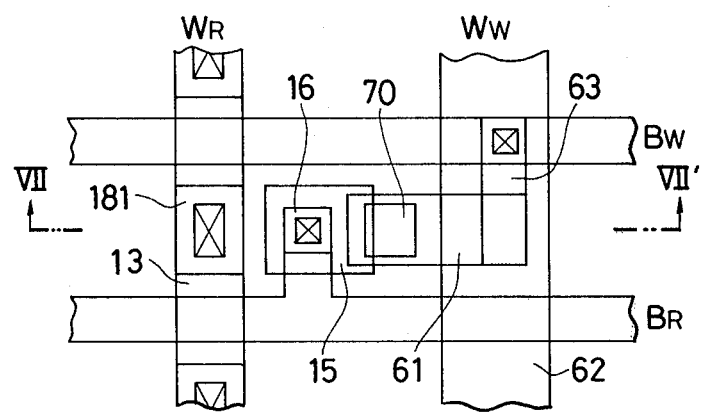
FIG. 7B is a schematic layout pattern of the fifth embodiment of the I²L type nonvolatile memory of this invention.
Figure 7C:
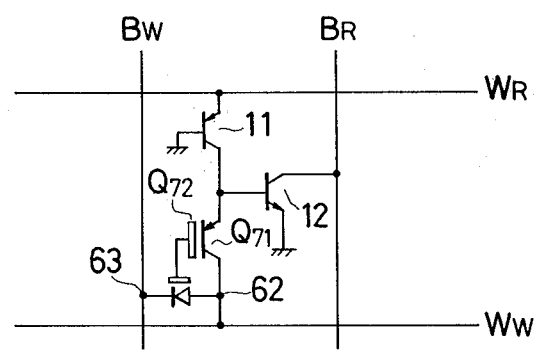
FIG. 7C is an equivalent circuit diagram of the fifth embodiment of the I²L type nonvolatile memory of this invention.

Embodiment 5:

FIGS. 7A, 7B and 7C show the structure of Embodiment 5. FIG. 7A is a sectional view taken along line VII-VII' in a schematic layout pattern of FIG. 7B, and FIG. 7C is an equivalent circuit diagram. In this embodiment, an N$^+$-type region (at an impurity concentration of, for example, $10^{19}$–$10^{21}$ cm$^{-3}$) 70 which usually forms the N$^+$-type collar portion of an I$^2$L is disposed under a floating gate 61. In this case, the potential of the base region 70 of a parasitic PNP transistor Q$_{71}$ formed by regions 15, 70, 14 and 62 is modulated by charges in the floating gate 61, thereby intending to modulate the current gain α of the parasitic PNP transistor. By variously changing the length (in the VII-VII' direction) and width (in the direction orthogonal to the VII-VII' direction) of the N$^+$-type region 70, the modification of the base potential of the PNP transistor Q$_{71}$ and the operation of a P-channel MOS transistor Q$_{72}$ employed in Embodiment 4 can be executed in parallel. By selecting the dimensions of the N$^+$-type region 70, accordingly, the extent of the conduction between the P-type regions 15 and 62 can be selected at will, and the device can be set at a conduction level easy of memory operation. The writing, erasing and reading modes are the same as in Embodiment 4.

Figure 8A:
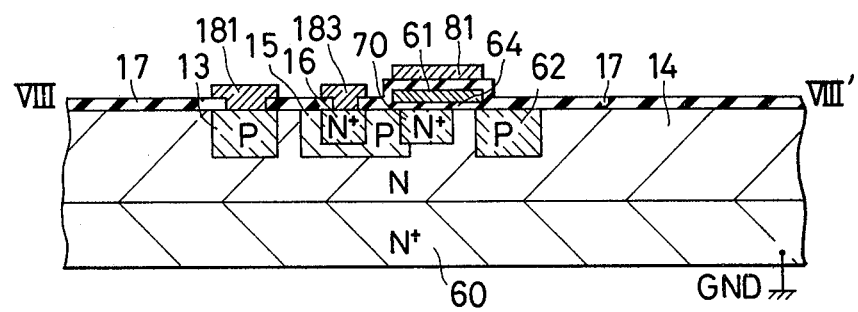
FIG. 8A is a sectional view showing a device structure of a sixth embodiment of the I²L type nonvolatile memory of this invention.
Figure 8B:
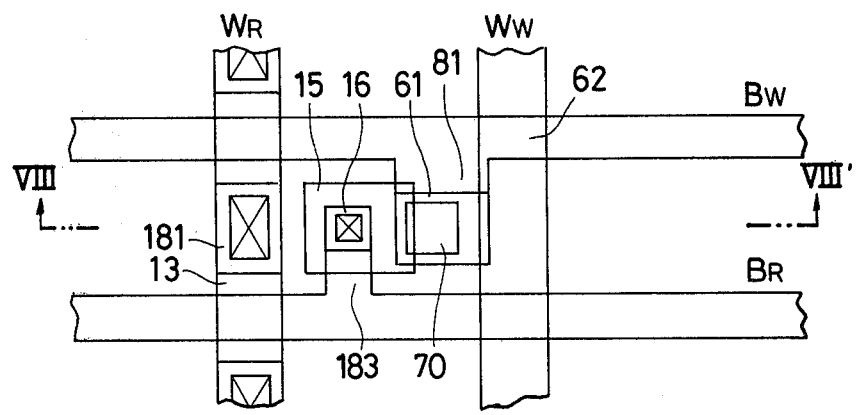
FIG. 8B is a schematic layout pattern of the sixth embodiment of the I²L type nonvolatile memory of this invention.
Figure 8C:
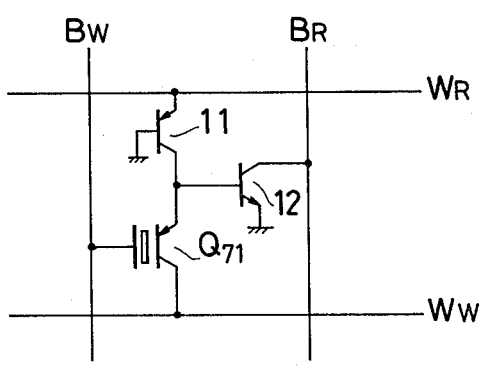
FIG. 8C is an equivalent circuit diagram of the sixth embodiment of the I²L type nonvolatile memory of this invention.

Embodiment 6:

FIGS. 8A, 8B and 8C show the structure of Embodiment 6. FIG. 8A is a sectional view taken along line VIII-VIII' in a schematic layout pattern of FIG. 8B, and FIG. 8C is an equivalent circuit diagram. This embodiment is such that a control gate (made of Al, polycrystalline Si or the like) 81 is disposed on a floating gate 61. Here is shown a device wherein the control gate is added on the structure of Embodiment 5.

Hereunder, the operations of the memory of this embodiment will be described.

(1) Writing mode; Under the state under which a reverse bias is applied across a line WW and a ground terminal GND so that the junction between a P-type layer 62 and an N-type layer 14 may become near avalanche (with a potential difference of, for example, 10–100 V), a positive high voltage is applied to a line BW (connected to the control gate 81). Then, electrons are accumulated into the floating gate to write data. As a result, the potential of an N$^+$-type region 70 is shifted onto the minus side, and the current gain α of a PNP transistor Q$_{71}$ increases.

(2) Erasing mode; Under the above state a negative high voltage (for example, $-10$–$-100$ V) is applied to the control gate 81, to draw holes and to erase the data.

(3) Reading mode; Current is applied to a line WR, and the level of a line BR is decided.

The floating gate 61 and the control gate 81 may be replaced with the so-called MNOS structure.

Even when the N$^+$-type layer 70 is removed from the present embodiment into a construction of the structure of Embodiment 4+ the control gate (or MNOS), quite the same effect is achieved.

Figure 9:
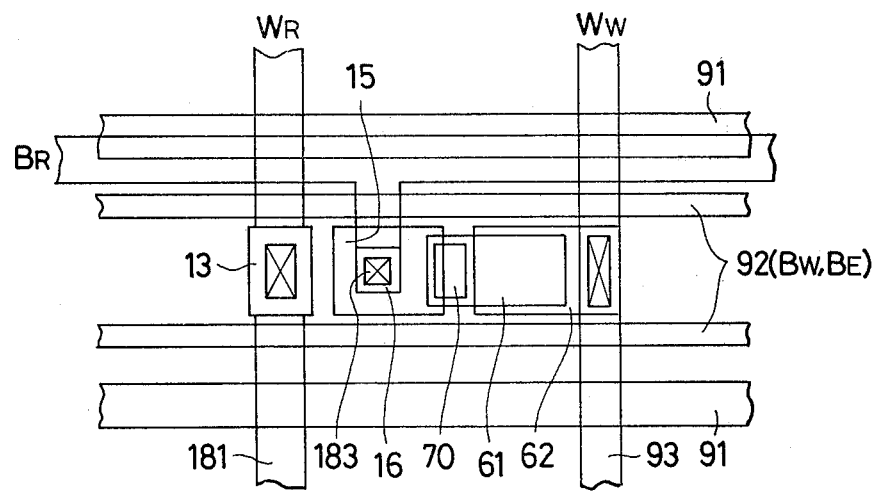
FIG. 9 is a schematic layout pattern of a seventh embodiment of the I²L type nonvolatile memory of this invention.

Embodiment 7:

FIG. 9 shows a seventh embodiment. In the figure, numeral 91 designates a P$^+$-type isolation region, numeral 92 an N$^+$-type collar, and numeral 93 a writing word line WW connected to a P-type region 62. In this embodiment, a reading bit line BR is also used to execute erasure.

(1) Writing mode; The avalanche breakdown is caused across the line WW and the line BW.

(2) Erasing mode; In the erasure, it suffices that all cells can be simultaneously erased, and hence, it is unnecessary to divide word lines and bit lines. Therefore, a voltage is increasingly applied across the line BE of all the cells (that is, a ground terminal line) and the line BR (that is, the collector of the I$^2$L) and with the line BR made the negative side. Then, breakdown starts across an N$^+$-type region 70 and a base P-type region 15 before a voltage (approximately 15 V or so) at which the C-E breakdown of a transistor occurs, the transistor being formed of the N-type layer 92 in contact with the ground terminal, the base P-type region 15 and a collector N+-type layer 16. A voltage at this time is usually the withstand voltage of the N+P junction which is a value near 7 V. Thus, while the avalanche is being caused, the line WW is brought into a negative potential to inject holes into a floating gate and to erase data.

Of course, the erasure is possible with ultraviolet rays.

(3) Reading mode; With the line BW (ground terminal) and the line WW held at the ground potential and with current applied to a desired line WR, the level of the desired line BR at this time is decided.

Figure 10A:
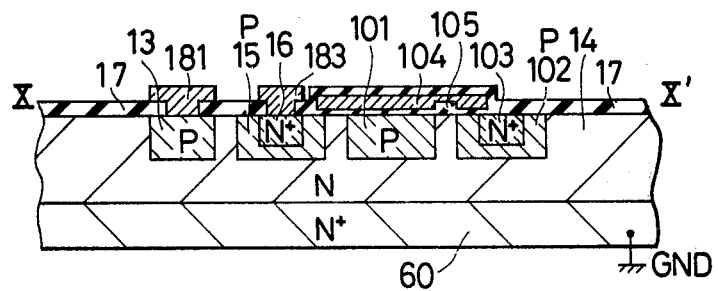
FIG. 10A is a sectional view showing a device structure of an eighth embodiment of the I²L type nonvolatile memory of this invention.
Figure 10B:
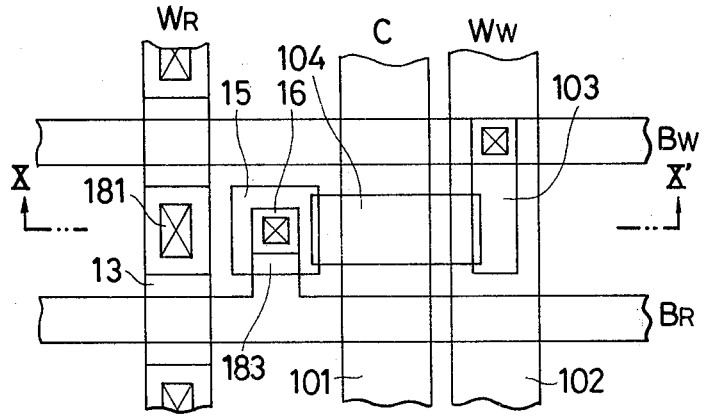
FIG. 10B is a schematic layout pattern of the eighth embodiment of the I²L type nonvolatile memory of this invention.

Embodiment 8:

FIGS. 10A and 10B show Embodiment 8. FIG. 10A is a sectional view of line X–X′ in a schematic layout pattern of FIG. 10B. In the memory of the structure wherein a floating gate 104 is disposed on the peripheral part of the base 15 of an I²L, to form the channel of a MISFET in the peripheral part of the base, there are disposed a P-type layer 101 for control and a P-type region 102 and an N-type region 103 for injecting charges into the floating gate.

(1) Writing mode; The junction between the regions 102 and 103 is brought into the avalanche breakdown or near avalanche, and the region 102 is made the zero potential. A ground terminal GND as well as the region 101 is made a positive potential with respect to the P-type region 102, to inject electrons into the floating gate 104.

(2) Erasing mode; With the P-type region 102 and the ground terminal GND held at the zero potential and with the P-type region 101 held at a negative potential, holes generated in the junction between the regions 102 and 103 are injected into the floating gate 104.

(3) Reading mode; With the P-type region 101 held at the ground potential and with current applied from a line WR (connected with an injector terminal 181), the level of a line BR (connected with a collector terminal 183) is decided. When electrons are stored in the floating gate 104, an inversion layer (N channel) is formed in the vicinity of the surface of that part of an N-type layer 14 which lies between the P-type regions 15 and 101, and the conductivity between the regions 15 and 101 rises. For this reason, current to ineffectively flow out of the region 15 into the region 101 increases, so that the current sinking or absorbing capability of the collector 16 of the I²L lowers and that the potential of the line BR shifts onto the high side. When the charges of the floating gate are erased, the N channel is not formed, and hence, the potential of the line BR shifts onto the low side. The difference of the potentials is read out.

Figure 11A:
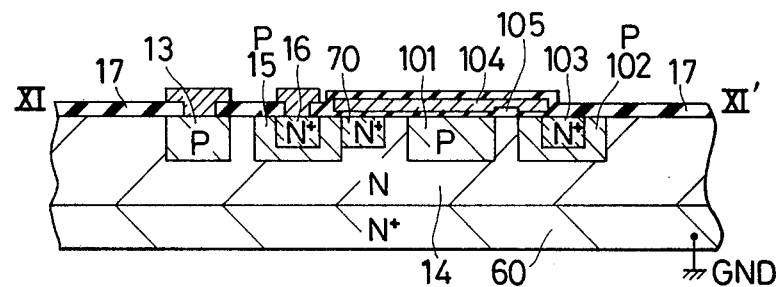
FIG. 11A is a sectional view showing a device structure of a ninth embodiment of the I²L type nonvolatile memory of this invention.
Figure 11B:
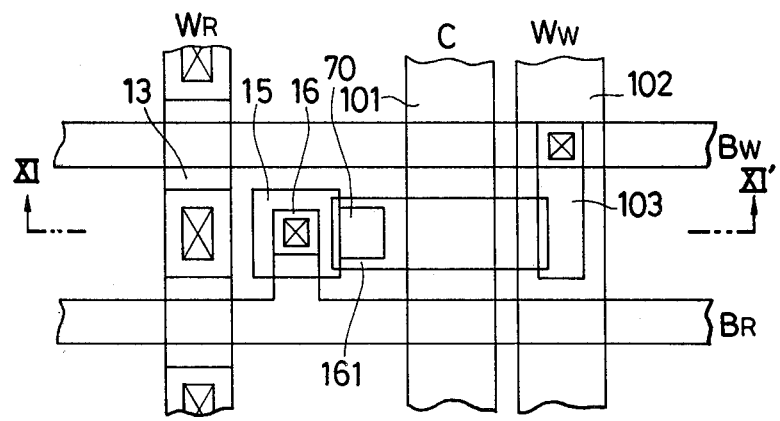
FIG. 11B is a schematic layout pattern of the ninth embodiment of the I²L type nonvolatile memory of this invention.

Embodiment 9:

FIGS. 11A and 11B show Embodiment 9. FIG. 11A is a sectional view taken along line XI–XI′ in a schematic layout pattern of FIG. 11B. This embodiment is such that an N+-type collar 70 is added in the peripheral part of the base of the I²L having the structure of Embodiment 8. Depending upon the existence or nonexistence of charges in the floating gate 104, the potential of the N+-type region 70 capacitively coupled with the floating gate 104 varies to vary the current gain α of the PNP transistor in the collar portion. The writing, erasing and reading modes are the same as in Embodiment 8.

In Embodiments 8 and 9, an oxide film 105 under only a part of the floating gate 104 is made thick. This measure intends to prevent the channel from being formed in the corresponding portion (between the writing P-type region 102 and the controlling P-type region 101) during writing or erasing. Accordingly, a channel stopper may well be formed by diffusing an N+-type layer into this portion.

Figure 12A:
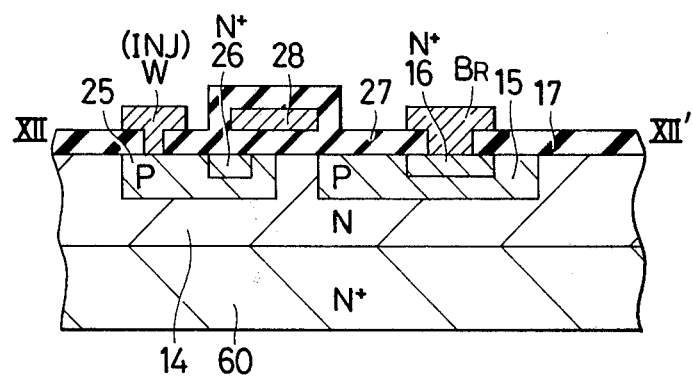
FIGS. 12A, 12B and 12C are a sectional view, a schematic layout pattern and an equivalent circuit diagram, respectively, showing a device structure of a tenth embodiment of the I²L type nonvolatile memory of this invention.
Figure 12B:
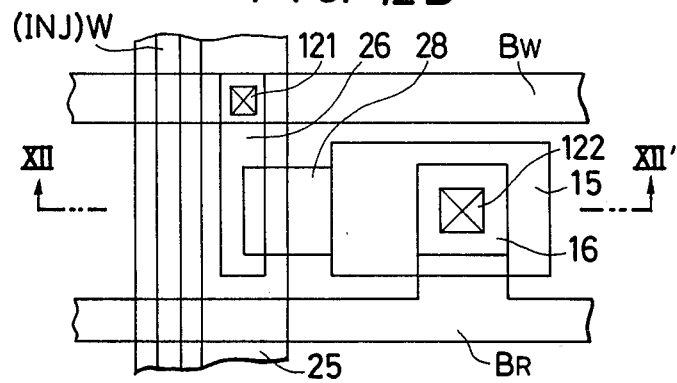
Figure 12C:
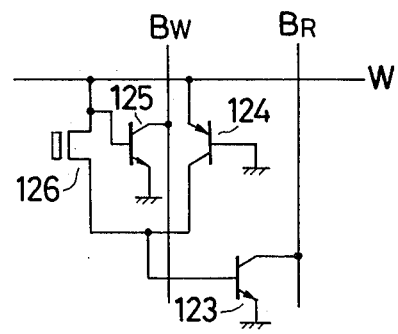

Embodiment 10:

FIGS. 12A, 12B and 12C are diagrams for explaining a tenth embodiment of the nonvolatile memory of this invention. FIG. 12A is a structural sectional view, FIG. 12B is a schematic layout pattern, and FIG. 12C is an equivalent circuit diagram. The sectional view of FIG. 12A is taken along line XII–XII′ in FIG. 12B.

Figure 1A:
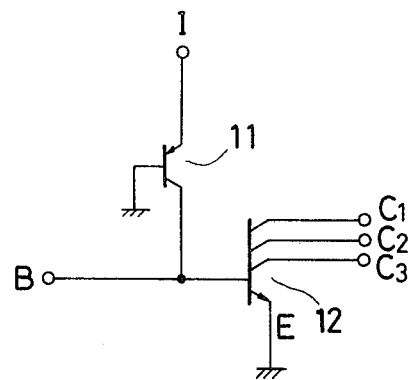
FIG. 1A is a circuit diagram showing an equivalent circuit of a prior-art I²L.
Figure 1B:
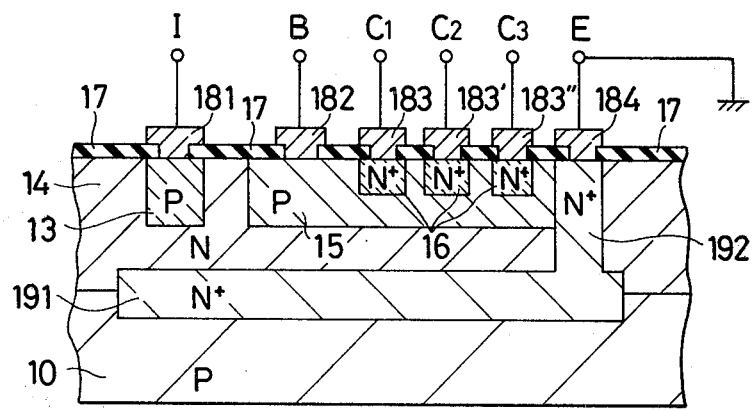
FIG. 1B is a sectional view showing a device structure of the prior-art I²L.

Referring to the figures, numeral 60 designates an N+-type buried layer or N+-type substrate which corresponds to the layer 191 in FIG. 1B and which is a Si body having an impurity concentration of $10^{18}$–$10^{21}$ cm$^{-3}$. Numeral 14 indicates an N-type silicon epitaxial layer whose impurity concentration is on the order of $10^{15}$–$10^{16}$ cm$^{-3}$, numeral 15 a P-type region whose impurity concentration is $10^{17}$–$10^{19}$ cm$^{-3}$, numeral 25 a P-type region which corresponds to the region 13 in FIG. 1B and whose impurity concentration is $10^{17}$–$10^{19}$ cm$^{-3}$, numeral 16 an N+-type region whose impurity concentration is $10^{19}$–$10^{21}$ cm$^{-3}$, and numeral 27 an insulating film (such as SiO₂ film). Numeral 28 indicates a floating gate which is made of polycrystalline silicon or the like and whose sheet resistance is 10–100 Ω/□, and numeral 26 an N+-type region which is disposed within the injector region 25 and which has an impurity concentration of $10^{17}$–$10^{19}$ cm$^{-3}$. Letters W, B$_W$ and B$_R$ denote electrode leads of Al or the like. Shown at 121 and 122 are electrode contact portions.

A transistor 123 in FIG. 12C is constructed of the regions 60, 14, 15 and 16 in FIG. 12A; a transistor 124 is constructed of the regions 25, 14 and 15; a transistor 125 is constructed of the regions 60, 14, 25 and 26; and a MISFET 126 is constructed of the regions 15 and 25, a gate insulating film 27 and the gate 28. When the structure is considered with the regions 26 and 28 in FIG. 12A removed, it is understood that an I²L is constructed of the transistors 123 and 124. In this invention, the floating gate 28 overlies the base of the PNP transistor of the I²L through the oxide film. Further, in order to make a PN junction for injecting carriers into the floating gate 28, the N+-type layer 26 is disposed within the injector region 25.

Operations as a memory are as follows.

(1) In case where no carrier (electron) exists within the floating gate 28, the channel of an insulated-gate field effect transistor (MIS FET) is not formed in the N-type layer 14 underneath the gate 28, and hence, the device operates as the conventional I²L circuit.

(2) When carriers (electrons) exist within the floating gate 28 and the channel is formed in the N-type layer 14 underneath the gate 28, there is established the form in which the common base type PNP transistor 124 and the MIS FET 126 are included in parallel between the P-type regions 25 and 15. In this case, current to flow into the transistor 123 is greater than in the case of (1), so that the collector current of the transistor 123 becomes greater.

In the above manner, the content of the memory can be read out depending upon the magnitude of the collector current of the NPN transistor 123.

Now, actual writing and reading methods will be described with reference to FIG. 12C.

(1) Writing mode:

Using the word line W (connected with the region 25) and the bit line $B_W$ (connected with the region 26) as required, a voltage (of 5–50 V or so) is applied so as to cause the PN junction (between the regions 25 and 26) to break down, whereby carriers are injected into the floating gate 28.

(2) Reading mode:

A voltage (approximately 0.7 V) is applied to the required word line W so that the regions 25 and 14 may be forward-biased, and data is read out from the bit line $B_R$ (connected to the region 16). The data is decided depending on the magnitude of current which flows through the bit line $B_R$.

(3) The memory content can be erased with ultraviolet rays.

Figure 13A:
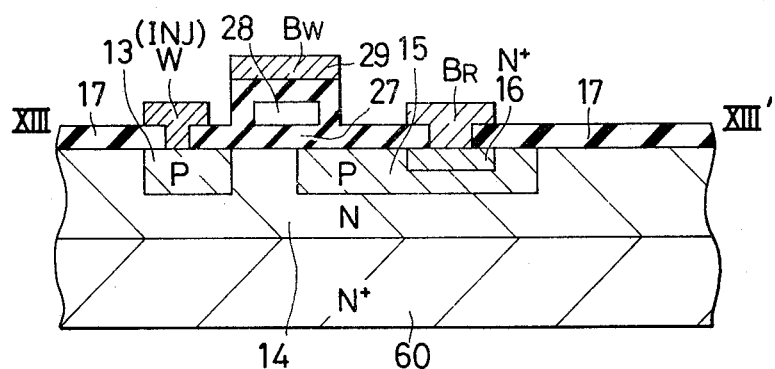
FIGS. 13A, 13B and 13C are a sectional view, a schematic layout pattern and an equivalent circuit diagram, respectively, showing a device structure of an eleventh embodiment of the I²L type nonvolatile memory of this invention.
Figure 13B:
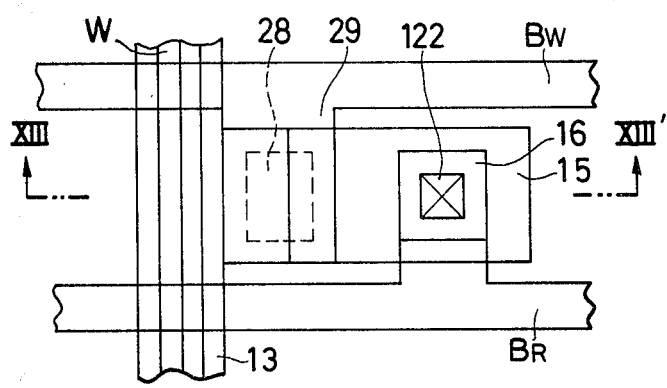
Figure 13C:
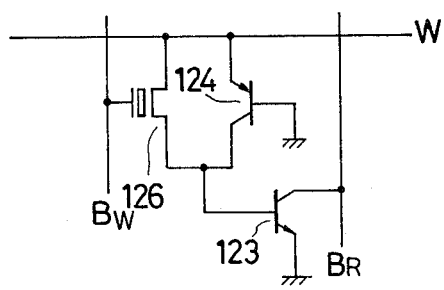

Embodiment 11:

FIGS. 13A, 13B and 13C show an eleventh embodiment. FIG. 13A is a sectional view taken along line XIII–XIII' in a schematic layout pattern of FIG. 13B, and FIG. 13C is an equivalent circuit diagram. This embodiment is an example wherein a writing gate electrode 29 disposed on a floating gate is employed as a writing method. The reading mode is the same as in Embodiment 10.

The writing is made by applying a high voltage to the writing gate electrode 29 (bit line $B_W$) under the state under which a channel is formed in the surface of an N-type layer 14 between P-type regions 15 and 13 and under which the junction between the P-type region 15 and the N-type layer 14 is reverse-biased to near avalanche while causing current to flow from the P-type region 13 with the P-type region 13 as well as the N-type layer 14 held at a high voltage and with an N-type region 16 held at a low voltage. In order to lower the writing voltage, a heavily doped P-type or N-type region may well be disposed between the P-type region 15 and the N-type layer 14.

In case of the system of this embodiment, the floating gate 28 is disposed with an oxide film intervening between it and the gate 29. The floating gate 28 can be replaced with an $Si_3N_4$ film. In that case, it is unnecessary to dispose the oxide film between the $Si_3N_4$ film and the gate 29. In the case of employing the $Si_3N_4$ film, there is the advantage that the memory content can be rewritten electrically without using ultraviolet rays.

Figure 14A:
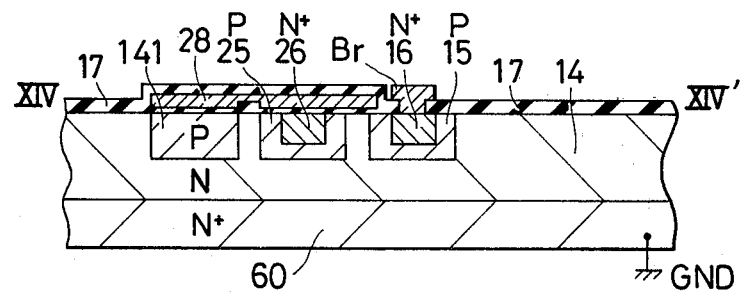
FIGS. 14A and 14B are a sectional view and a schematic layout pattern, respectively, showing a device structure of a twelfth embodiment of the I²L type nonvolatile memory of this invention.
Figure 14B:
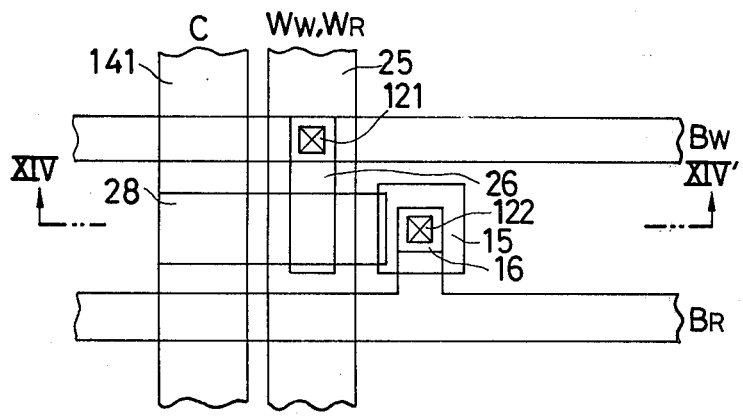

Embodiment 12:

FIGS. 14A and 14B are views for explaining a twelfth embodiment of the nonvolatile memory of this invention. FIG. 14A is a sectional view taken along line XIV–XIV' in a schematic layout pattern of FIG. 14B.

The device of this embodiment differs from Embodiments 10 and 11 in the method of writing into the floating gate 28. That is, a P-type region 141 is disposed as illustrated in the figures. The P-type region 141 is used as a control region (line C) for writing. Also this device utilizes the fact that, when charges exist in the floating gate 28, the channel for the MISFET operation is formed between the injector region 25 and the base region 16.

Hereunder will be described the writing mode, erasing mode and reading mode at the time when the device shown in FIGS. 14A and 14B is operated as the nonvolatile memory.

(1) Writing mode; A positive potential is applied to a line $B_W$ (in touch with an N+-type region 26 by means of a contact 121) with respect to a line $W_W$ (P-type region 25), to bias the junction between the P-type region 25 and the N+-type region 26 into the state of avalanche breakdown or the state of the so-called near avalanche. Further, a positive voltage which is great in a range not causing the breakdown is applied to the line C (control region 141) as well as a ground terminal GND, with respect to the line $W_W$. Then, the P-type region 141 exhibits the function of a control gate for the floating gate 28, and the potential of the floating gate 28 is drawn onto the positive side with respect to the $W_W$ line 25. Therefore, among carriers generated in the vicinity of the junction between the regions 25 and 26, electrons are principally injected into the floating gate 28, so that the writing is made.

(2) Erasing mode; Likewise to the writing, the junction between the regions 25 and 26 is biased into the avalanche breakdown state or the near avalanche state. At this time, however, the $W_W$ line 25 and the ground terminal are held at the ground potential (zero potential), and a great negative voltage is applied to the C line 141 in a range not causing the breakdown. Thus, the potential of the floating gate 28 shifts onto the negative potential side. Accordingly, holes are injected into the floating gate 28 from the junction between the regions 25 and 26, so that the erasing is made.

(3) Reading mode; Current is injected by applying a positive voltage to a line $W_R$ (injector region 25), and it is decided whether the level of a line $B_R$ (connected with the region 16 by a contact portion 122) is "high" or "low".

When electrons are accumulated in the floating gate, an inversion layer (N-type channel) is formed in the vicinity of the surface of an N-type layer 14 between P-type regions 15 and 25. Accordingly, the injector current of the $I^2L$ increases, so that the absorption current of the collector 16 increases and that the potential of the $B_R$ line shifts onto the "low" side. On the other hand, when no charge is accumulated in the floating gate or holes are accumulated therein, the potential of the $B_R$ line varies onto the "high" side. This variation is read out. During the readout, the C line is held at the same potential as that of the $W_R$ line, or it is made open or the ground potential.

The positions of the region 141 and the regions 25, 26 in this embodiment can be replaced with each other. In this case, the C line 141 corresponds to the injector of the $I^2L$. The writing and erasing modes may be as explained in this embodiment. In the reading mode, the region 141 is used as the $W_R$ line, and the potential of the region 25 as well as the region 26 is made a suitable value.

The $I^2L$ type nonvolatile memories according to the above embodiments 10, 11 and 12 have the following features.

(1) Unlike the prior-art nonvolatile memory based on the mere MISFET, the current which is subjected to the channel modulation or shift underneath the floating gate is employed as the base current of the inverse NPN transistor constituting the $I^2L$.

(2) As the result of (1), the modulated or shifted channel current is amplified by the inverse NPN transistor, and hence, the detection of the memory content is facilitated.

(3) In combining the I²L and the nonvolatile memory structure based on the floating gate, the generation of a high voltage for writing, the detection for readout, etc. can be readily effected with conventional linear circuit techniques because the I²L are easily compatible with ordinary linear circuits.

The essential points of the nonvolatile memories of Embodiments 10, 11 and 12 are as follows.

(1) A structure wherein a floating gate is disposed over the base portion of the PNP transistor of an I²L.

(2) A structure wherein a floating gate is disposed astride over an N-type layer 26 provided within the injector of an I²L (FIG. 12A).

(3) A structure wherein a floating gate is disposed astride over a P-type region 15 being the base of the inverse NPN transistor of an I²L (FIG. 13A).

(4) A structure wherein in order to lower a writing voltage in the structure of FIG. 13A, a heavily doped P-type region or N-type region is disposed at a part of the junction between the P-type region 15 and an N-type layer 14.

(5) A method wherein the writing resorts to the breakdown of a PN junction.

(6) A method wherein the writing resorts to the breakdown of a PN junction and the promotion of the writing by the application of a positive voltage to a controlling gate electrode.

(7) A method wherein the erasing resorts to irradiation with ultraviolet rays.

(8) A method wherein the erasing resorts to the breakdown of a PN junction and the promotion of the injection of holes by the application of a negative voltage to the controlling gate electrode.

(9) A structure wherein the stacked films of a thin gate oxide film (at most 100 Å thick) and an $Si_3N_4$ film are comprised instead of the floating gate (the so-called MNOS structure).

(10) A structure wherein in order to write data into the floating gate, a P-type region and an N-type region disposed within the P-type region are comprised separately from the I²L structure, and the writing is effected by resorting to the breakdown of the PN junction between the P-type region and the N-type region.

Figure 15:
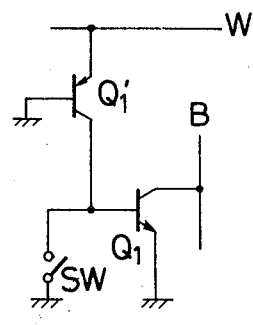
FIG. 15 is an equivalent circuit diagram of a first sort of the I²L type nonvolatile memory of this invention.

As illustrated in FIG. 15, the first type nonvolatile memory (Embodiments 1-9) of this invention is characterized by being constructed of a switch element SW for storing data and an I²L circuit (made up of transistors $Q_1$ and $Q_1'$) for amplifying the data and feeding a signal to a bit line B.

The switch element SW for storing the data is constructed of a MISFET employing a floating gate, a PNP transistor with a floating gate, or a MISFET of the MNOS structure, and it is connected to the base of the NPN transistor of the I²L circuit. Whether this switch SW is in the "on" state or "off" state is amplified by the NPN transistor of the I²L portion, to provide the bit line with the signal.

Figure 16:
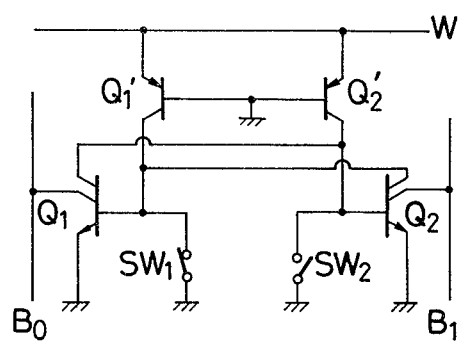
FIG. 16 is an equivalent circuit diagram showing a flip-flop circuit which is constructed by the use of the first sort of the I²L type nonvolatile memory of this invention.

In accordance with the memory of the above construction, a flip-flop circuit can be constructed by employing two memory circuits in FIG. 15 as illustrated in FIG. 16. In such case, inverse data are respectively written into switches $SW_1$ and $SW_2$ (in case where the switch $SW_1$ is put into the "on" state, the switch $SW_2$ is put into the "off" state).

In case where the flip-flop circuit is constructed as shown in FIG. 16, there is the advantage that the difference between the "on" and "off" states of the switch may be smaller than in the case of the circuit of FIG. 15. That is, in case where the switch $SW_1$ is in the "on" state more than the switch $SW_2$ even slightly, the rise of the base voltage of the NPN transistor $Q_1$ becomes later than the rise of the base voltage of the NPN transistor $Q_2$ when currents have started flowing through the PNP transistors $Q_1'$ and $Q_2'$ upon selection of a word line W. Since the NPN transistors $Q_1$ and $Q_2$ constitute the flip-flop circuit, the positive feedback is applied with the rises of the base voltages of the transistors $Q_1$ and $Q_2$, the rise of the base voltage of the transistor $Q_1$ becomes increasingly slower than that of the transistor $Q_2$, and ultimately, the NPN transistors $Q_1$ and $Q_2$ become the "off" and "on" states respectively and stable. That is, the circuit of FIG. 16 carries out the same operation as that of a latent memory which is usually known well. In this manner, in the circuit arrangement of FIG. 16, the difference of the states becomes more definite between cases where the signals of data appearing on the bit lines $B_0$ and $B_1$ are "1" and "0". In addition, since the bit line signal can be provided by means of a differential pair, there is the advantage that the detection of the bit line signal is facilitated.

Figure 17:
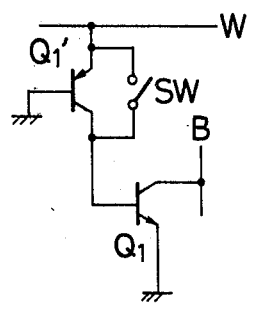
FIG. 17 is an equivalent circuit diagram of a second sort of the I²L type nonvolatile memory of this invention.

The second type nonvolatile memory (Embodiments 10-12) of this invention can be put into a model as illustrated in FIG. 17. It is equivalent to a memory cell in which a switch element SW is connected in parallel with the PNP transistor $Q_1'$ of an I²L circuit. The switch element SW is constructed of a MISFET having a floating gate, or a MISFET of the MNOS structure.

Figure 18:
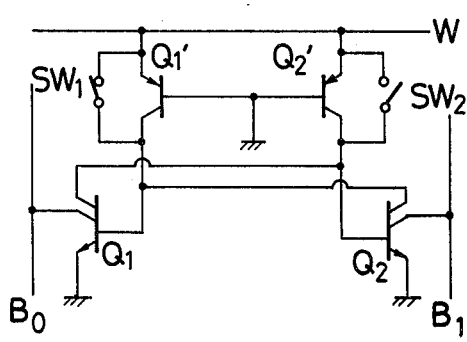
FIG. 18 is an equivalent circuit diagram showing a flip-flop circuit which is constructed by the use of the second sort of the I²L type nonvolatile memory of this invention.

Also in case of this circuit, likewise to the circuit of FIG. 15, a flip-flop circuit can be constructed by employing two memory cells in FIG. 17 as illustrated in FIG. 18. In such case, merely by bestowing some difference on the states of the switches $SW_1$ and $SW_2$, the rises of the base voltages of the NPN transistors $Q_1$ and $Q_2$ can be made different when the word line W has been selected. Therefore, the flip-flop circuit can be operated as a latent memory as in the case of FIG. 16, and it has the same advantage as stated in conjunction with FIG. 16.

As described above, both the types of "nonvolatile memories" of this invention can be operated as the latent memories by constructing the flip-flop circuits.

A flip-flop circuit can also be constructed by employing both the nonvolatile memories in FIGS. 15 and 17.

Hereunder will be described an example in which the memories in FIGS. 15 and 17 are combined.

Figure 19:
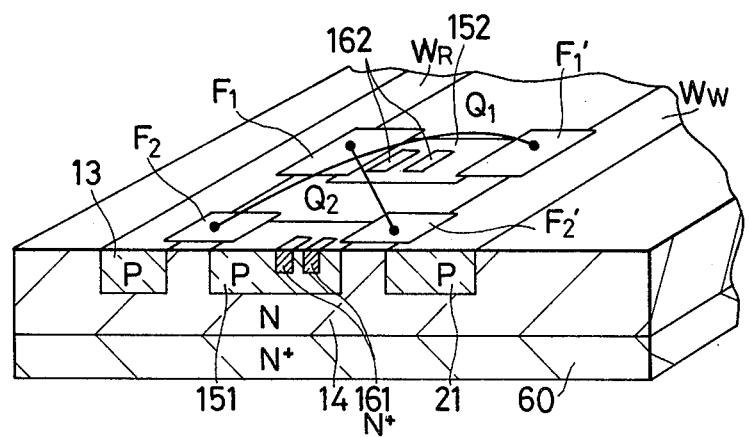
FIG. 19 is a conceptual view showing a flip-flop circuit which is constructed by the use of the first and second sorts of the I²L type nonvolatile memories of this invention.

FIG. 19 is a conceptual view of this example. A floating gate $F_1$ between the injector 13 of a transistor $Q_1$ and the base 152 of the transistor $Q_1$ is connected with a floating gate $F_2'$ between the base 151 and P-type layer 21 of a transistor $Q_2$. Further, a floating gate $F_2$ between the injector 13 of the transistor $Q_2$ and the base 151 thereof is connected with a floating gate $F_1'$ between the base 152 and P-type layer 21 of the transistor $Q_1$.

It is supposed by way of example that the floating gates $F_1$ and $F_2'$ are charged with electrons, while the floating gates $F_2$ and $F_1'$ are charged with holes (or left under the uncharged condition). In this case, channels are formed under the gates $F_1$ and $F_2'$ so that the conduction is easy, whereas no channel is formed under the gates $F_2$ and $F_1'$ so that the conduction is hard. These promotes the positive feedback of the flip-flop circuit still more. Therefore, the transistor $Q_1$ is more liable to turn "on" and the transistor is more liable to turn "off" than those of the nonvolatile memory of the form which employs only either the gates $F_1$, $F_2$ or the gates $F_1'$, $F_2'$, and hence, this flip-flop circuit has the advantage that the discrimination of "1" and "0" is easier. In the figure, numeral 60 indicates an N+-type layer, numeral 14 an N-type layer, and numerals 161 and 162 N+-type regions serving as collectors.

Figure 20A:
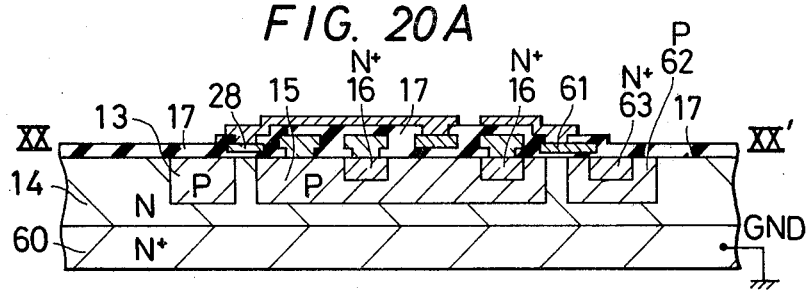
FIGS. 20A, 20B and 20C are a device structural section, a schematic layout pattern and an equivalent circuit diagram of an embodiment of a flip-flop circuit which is constructed by the use of the I²L type nonvolatile memories of this invention, respectively.
Figure 20B:
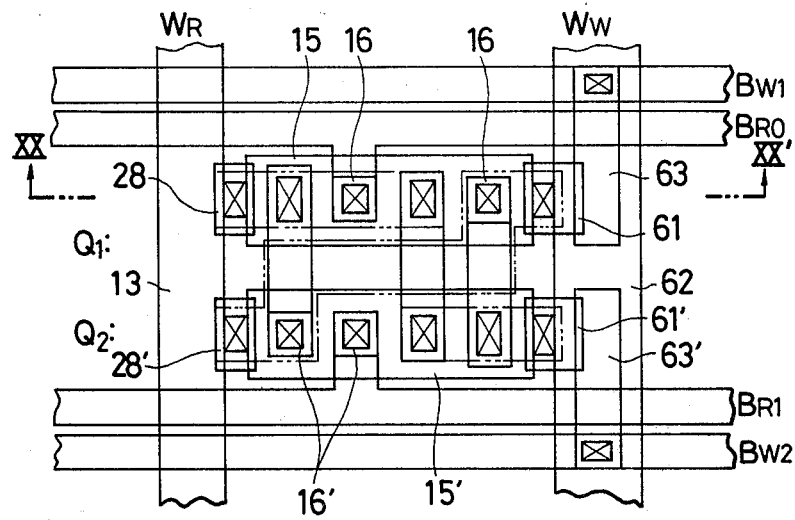
Figure 20C:
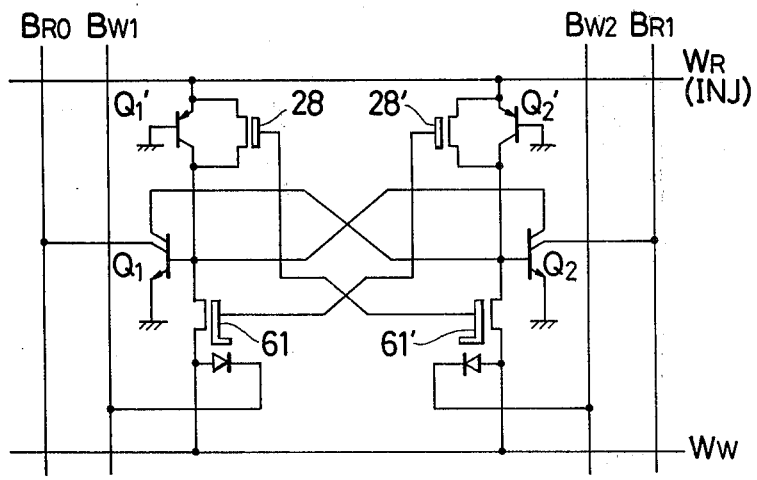

Embodiment 13:

FIGS. 20A, 20B and 20C are structural diagrams of a first embodiment in the combination form. Here, the structure of FIG. 19 is realized by the use of two-layered interconnections, and PN-junction regions (corresponding to $W_W$, $B_{W1}$ and $B_{W2}$) for writing are further added. FIG. 20A is a sectional view taken along line XX–XX' in FIG. 20B, and the interconnections of the second layer are indicated by one-dot chain lines in a plan view of FIG. 20B. FIG. 20C is an equivalent circuit diagram.

Writing mode; In case of intending to turn a transistor $Q_1$ "off" and a transistor $Q_2$ "on", the avalanche breakdown is caused between the writing word line $W_W$ (P-type region 62 of a control region) and bit line $B_{W1}$ (N+-type region 63), to inject electrons into a floating gate 61 and a floating gate 28' connected therewith. Concretely, all cells are erased by irradiating them with ultraviolet rays in advance. Subsequently, a positive voltage of about 7–30 V is applied to the $B_{W1}$ line with respect to the $W_W$ line, to induce the avalanche breakdown between the P-type region 62 and the N+-type region 63. Then, between electrons and holes generated by the avalanche, the electrons are higher in the probability of arriving at the floating gates by passing through an oxide film, and hence, the injection of the electrons is effected and the floating gates are written into a negative potential. (In case of intending to bring the transistors $Q_1$ and $Q_2$ into the inverse states, writing is made between the line $W_W$ and the line $B_{W2}$ after the erasure with ultraviolet rays.)

Reading mode; All the line $W_W$ and lines $B_{W1}$ and $B_{W2}$ are held at the ground potential. A positive voltage (approximately 0.7 V) with respect to the ground is applied to a line $W_R$, to inject current thereinto. The line $W_R$ (P-type region 13) functions as the injector of the I²L. Owing to the previous writing, the floating gate 61 and the floating gate 28' connected therewith store the electrons therein and are negatively charged. Thus, inversion layers (P channels) are formed in those parts of an N-type layer 14 which underlie the gate 28' and the gate 61. For this reason, the injector current of the transistor $Q_2$ flows in more than that of the transistor $Q_1$, so that the transistor $Q_2$ is higher in the degree of "on" than the transistor $Q_1$. In addition, current escaping from the base of the transistor $Q_1$ to the line $W_W$ of the control region becomes more than current escaping from the base of the transistor $Q_2$ to the line $W_W$, and this functions in the direction of turning the transistor $Q_1$ "off" still more. Accordingly, a line $B_{R0}$ becomes open and a line $B_{R1}$ becomes a low level, and "1" or "0" can be read out. (When the writing has been made with the lines $B_{W2}$ and $W_W$, the transistor $Q_1$ approaches "on" and the transistor $Q_2$ approaches "off," and the levels of the lines $B_{R0}$ and $B_{R1}$ become the inverse. Thus, "1" or "0" is discriminated.)

Erasing mode; A memory content is erased with ultraviolet rays.

Figure 21A:
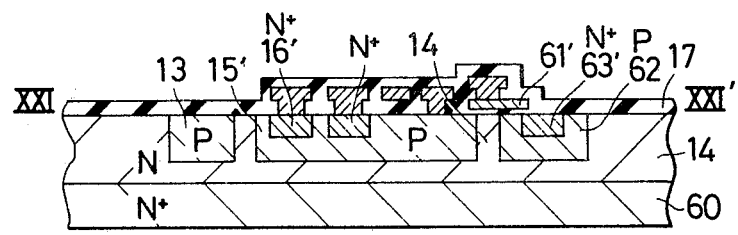
FIGS. 21A, 21B and 21C are a device structural section, a schematic layout pattern and an equivalent circuit diagram of another embodiment of a flip-flop circuit which is constructed by the use of the I²L type nonvolatile memory of this invention, respectively.
Figure 21B:
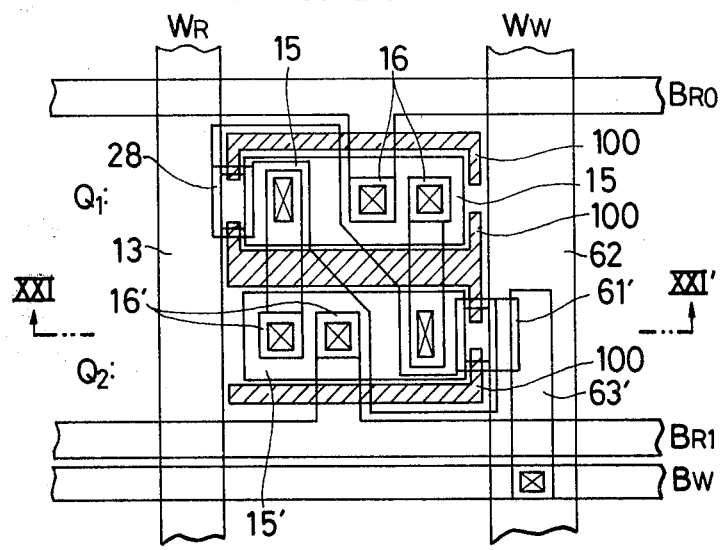
Figure 21C:
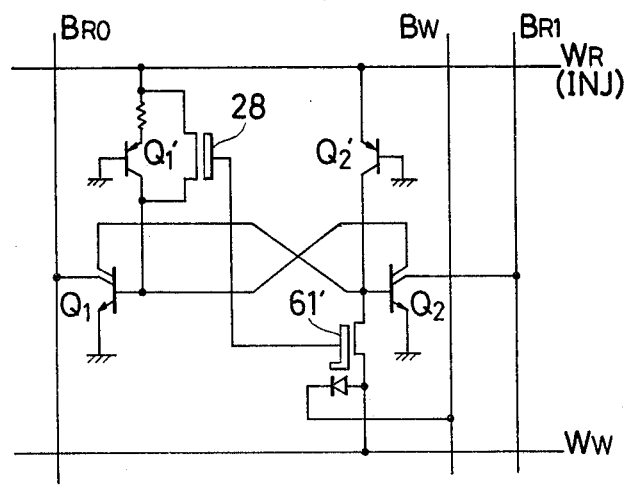

Embodiment 14:

FIGS. 21A, 21B and 21C are structural diagrams of a second embodiment in the combinational form. In the preceding embodiment 13, the two lines of the line $B_{W1}$ on the $Q_1$ side and the line $B_{W2}$ on the $Q_2$ side are required as the writing bit lines. In this embodiment, a significant difference is given between the transistors $Q_1$ and $Q_2$ in the pattern shape of an N+-type collar 100 surrounding the base of an I²L, whereby the transistor $Q_2$ turns "on" earlier whenever there is no influence by the floating gate (in the erased state). In this embodiment, the N+-type collars 100 are laid out so that the facing length between the injector and the base of the transistor $Q_1$ may become shorter than that of the transistor $Q_2$. (Hatches in FIG. 21B indicate the N+-type collars, and do not represent sections.) In case of such structure, levels are determined so that all the transistors $Q_2$ turn "on" in the state in which all the cells are erased.

Writing mode; Only in a place where it is desired to change the state of the transistor $Q_1$ into "on" and the state of the transistor $Q_2$ into "off," a reverse bias is applied to the junction between a line $W_W$ and a line $B_W$ to cause the avalanche breakdown and to inject electrons into the floating gate.

Reading mode; An injector current is injected from a line $W_R$, and the decision resorts to the sign of the level difference between lines $B_{R0}$ and $B_{R1}$. At this time, the levels of the lines $W_W$ and $B_W$ are made similar to those in Ebodiment 13.

Erasing mode; Ultraviolet rays are used.

What is claimed is:

1. A nonvolatile semiconductor memory comprising: a first I²L (integrated injection logic device) which consists of a first NPN transistor and a first PNP transistor disposed in a surface region of a semiconductor substrate, a second I²L which consists of a second NPN transistor and a second PNP transistor disposed in a surface region of the identical semiconductor substrate, a first collector of said first NPN transistor and a base of said second NPN transistor being connected, a first collector of said second NPN transistor and a base of said first NPN transistor being connected, respective second collectors of said first and second NPN transistors being used as output terminals, and a first floating gate which is disposed on a base region of said first PNP transistor through an insulating film, a second floating gate which is disposed on a base region of said second PNP transistor through an insulating film, a third floating gate which is disposed through an insulating film on a surface region of said semiconductor substrate between the base region of of said first NPN transistor and a control region disposed in opposition to this base region, and a fourth floating gate which is disposed through an insulating film on a surface region of said semiconductor substrate between the base region of said second NPN transistor and a control region disposed in opposition to this base region, and means for injecting charges into said floating gates.

2. A nonvolatile semiconductor memory according to claim 1, wherein said first and fourth floating gates are connected, and second and third floating gates are connected.

3. A nonvolatile semiconductor memory according to claim 2, wherein a base width of said first PNP transistor is smaller than that of said second PNP transistor.

4. In an integrated injection logic device having a semiconductor substrate of a first conductivity type, an injector region which has a second conductivity type opposite to said first conductivity type and which is disposed in a surface region of said substrate, a base region of said second conductivity type which is disposed in a surface region of said substrate in a manner to be spaced from said injector region, and a collector region of said first conductivity type which is disposed within said base region;

a nonvolatile semiconductor memory comprising:

charge storage means disposed on the base region and/or the substrate surface region adjacent to said base region, and means for injecting charges into said charge storage means, wherein a control region is further comprised which is disposed in the substrate surface region in a manner to be spaced from said base region and which has said second conductivity type, and said charge storage means is made up of a floating gate which is disposed through an insulating film on the substrate surface region between said base region and said control region, and further wherein a writing region of said first conductivity type is disposed within said control region, said floating gate extends on said writing region, and a PN junction between said writing region and said control region and means for reverse-biasing said PN junction are used as the charge injection means.

5. In an integrated injection logic device having a semiconductor substrate of a first conductivity type, an injector region which has a second conductivity type opposite to said first conductivity type and which is disposed in a surface region of said substrate, a base region of said second conductivity type which is disposed in a surface region of said substrate in a manner to be spaced from said injector region, and a collector region of said first conductivity type which is disposed within said base region;

a nonvolatile semiconductor memory comprising:

charge storage means disposed on the base region and/or the substrate surface region adjacent to said base region, and means for injecting charges into said charge storage means, wherein a control region is further comprised which is disposed in the substrate surface region in a manner to be spaced from said base region and which has said second conductivity type, and said charge storage means is made up of a floating gate which is disposed through an insulating film on the substrate surface region between said base region and said control region, and further wherein a charge injection region for injecting charges into said floating gate is further comprised in the substrate major surface region, said charge injection region consists of a first region of said second conductivity type and a second region of said first conductivity type which is disposed within said first region, said floating gate extends on said second region, and a PN junction within said charge injection region and means for reverse-biasing said PN junction are used as the charge injection means.

6. A nonvolatile semiconductor memory comprising in major surface regions of a semiconductor substrate of one conductivity type an injection region which has a conductivity type opposite to that of said substrate, a base region of the opposite conductivity type which is disposed in a manner to be spaced from said injector region, a collector region of said one conductivity type which is disposed within said base region, a control region of the opposite conductivity type which is disposed in a manner to be spaced from said base region, and a floating gate which is disposed through an insulating film on the major surface of said semiconductor substrate between said control region and said base region, and further comprising means for injecting charges into said floating gate, wherein a writing region of said first conductivity type is disposed within said control region, said floating gate extends on said writing region, and a PN junction between said writing region and said control region and means for reverse-biasing said PN junction are used as the charge injection means.

7. A nonvolatile semiconductor memory comprising in major surface regions of a semiconductor substrate of one conductivity type an injector region which has a conductivity type opposite to that of said substrate, a base region of the opposite conductivity type which is disposed in a manner to be spaced from said injector region, a collector region of said one conductivity type which is disposed within said base region, a control region of the opposite conductivity type which is disposed in a manner to be spaced from said base region, and a floating gate which is disposed through an insulating film on the major surface of said semiconductor substrate between said control region and said base region, and further comprising means for injecting charges into said floating gate, wherein a charge injection region for injecting charges into said floating gate is further comprised in the substrate major surface region, said charge injection region comprising a first region of said second conductivity type and a second region of said first conductivity type which is disposed within said first region, said floating gate extends on said second region, and a PN junction within said charge injection region and means for reverse-biasing said PN junction are used as the charge injection means.

8. A nonvolatile semiconductor memory comprising in major surface regions of a semiconductor substrate of one conductivity type an injector region which has a conductivity type opposite to that of said substrate, a base region of the opposite conductivity type which is disposed in a manner to be spaced from said injector region, a collector region of said one conductivity type which is disposed within said base region, and a floating gate which is disposed through an insulating film on the major surface of said substrate between said injector region and said base region, and further comprising means for injecting charges into said floating gate, wherein a writing region of said first conductivity type is disposed within said injector region, said floating gate extends on said writing region, and a PN junction between said writing region and said injector region and means for reverse-biasing said PN junction are used as the charge injection means.

9. A nonvolatile semiconductor memory comprising in major surface regions of a secmiconductor substrate of one conductivity type an injector region which has a conductivity type opposite to that of said substrate, a base region of the opposite conductivity type which is disposed in a manner to be spaced from said injector region, a collector region of said one conductivity type which is disposed within said base region, and a floating gate which is disposed through an insulating film on the major surface of said substrate between said injector region and said base region, and further comprising means for injecting charges into said floating gate, wherein said charge injection region comprises a first region of said second conductivity type and a second region of said first conductivity type which is disposed within said first region, said floating gate extends on said second region, and a PN junction within said charge injection region and means for reverse-biasing said PN junction are used as the charge injection means.

10. A nonvolatile semiconductor memory according to claim 2, wherein a base length of said first PNP transistor is smaller than that of said second PNP transistor.

11. In an integrated injection logic device having a semiconductor substrate of a first conductivity type, an injector region which has a second conductivity type opposite to said first conductivity type and which is disposed in a surface region of said substrate, a base region of said second conductivity type which is disposed in a surface region of said substrate in a manner to be spaced from said injector region, and a collector region of said first conductivity type which is disposed within said base region;
 a nonvolatile semiconductor memory comprising:
 charge storage means disposed on the base region and/or
 the substrate surface region adjacent to said base region, and
 means for injecting charges into said charge storage means,
 wherein said charge storage means is made up of a floating gate which is disposed through an insulating film on the substrate surface region between said injector region and said base region, and further wherein a writing region of said first conductivity type is disposed within said injector region, said floating gate extends on said writing region, and a PN junction between said writing region and said injector region and means for reverse-biasing said PN junction are used as the charge injection means.

12. In an integrated injection logic device having a semiconductor substrate of a first conductivity type, an injector region which has a second conductivity type opposite to said first conductivity type and which is disposed in a surface region of said substrate, a base region of said second conductivity type which is disposed in a surface region of said substrate in a manner to be spaced from said injector region, and a collector region of said first conductivity type which is disposed within said base region;
 a nonvolatile semiconductor memory comprising:
 charge storage means disposed on the base region and/or the substrate surface region adjacent to said base region, and
 means for injecting charges into said charge storage means,
 wherein said charge storage means is made up of a floating gate which is disposed through an insulating film on the substrate surface region between said injector region and said base region, and further wherein a charge injection region for injecting charges into said floating gate is further comprised in the substrate major surface region, said charge injection region consists of a first region of said second conductivity type and a second region of said first conductivity type which is disposed within said first region, said floating gate extends on said second region, and a PN junction within said charge injection region and means for reverse-biasing said PN junction are used as the charge injection means.

13. A nonvolatile semiconductor memory according to claim 4, 5, 6 or 7, wherein a heavily doped region of said first conductivity type is disposed in the substrate major surface region under said floating gate, in contact with said base region.

14. A nonvolatile semiconductor memory according to claim 4, 5, 6 or 7, wherein a controlling gate is further disposed on said floating gate through an insulating film, and a predetermined voltage is applied to said controlling gate, thereby to promote the injection of charges into said floating gate.

15. A nonvolatile semiconductor memory according to claim 4, 5, 6 or 7, wherein said semiconductor substrate is made of silicon, said floating gate is made of polycrystalline silicon, and said insulating film is made of silicon oxide.

16. A nonvolatile semiconductor memory according to claim 8 or 9, wherein a controlling gate is further disposed on said floating gate through an insulating film, and a predetermined voltage is applied to said controlling gate, thereby to promote the injection of charges into sid floating gate.

17. A nonvolatile semiconductor memory according to claim 8 or 9, wherein said semiconductor substrate is made of silicon, said floating gate is made of polycrystalline silicon, and said insulating film is made of silicon oxide.

* * * * *